(12) United States Patent
McKeown

(10) Patent No.: US 6,735,972 B2
(45) Date of Patent: May 18, 2004

(54) APPARATUS AND METHOD TO SUBSTANTIALLY MINIMIZE LOW-CYCLE FATIGUE OF ELECTRICAL CONNECTIONS

(75) Inventor: Stephen A. McKeown, Endicott, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 29 days.

(21) Appl. No.: 10/106,561

(22) Filed: Mar. 26, 2002

(65) Prior Publication Data

US 2003/0182959 A1 Oct. 2, 2003

(51) Int. Cl.[7] ............................................... F25D 23/12
(52) U.S. Cl. ......................................... 62/259.2; 62/3.7
(58) Field of Search ................................. 62/259.2, 3.2, 62/3.7

(56) References Cited

U.S. PATENT DOCUMENTS

| | | | |
|---|---|---|---|
| 4,963,414 A | | 10/1990 | LeVasseur et al. |
| 5,188,286 A | * | 2/1993 | Pence, IV .................... 236/1 F |
| 5,584,183 A | * | 12/1996 | Wright et al. .................. 62/3.7 |

* cited by examiner

*Primary Examiner*—Melvin Jones
(74) *Attorney, Agent, or Firm*—Charles L. Moore; Geoffrey H. Krauss

(57) ABSTRACT

An apparatus to substantially minimize low-cycle fatigue of at least one electrical connection between a first component and a second component includes at least one thermoelectric device to thermally contact at least the first component and includes at least one sensor that is coupled to at least one of the first component or the second component. A controller is provided and coupled to the at least one thermoelectric device and to the at least one sensor. The controller controls operation of the thermoelectric device to substantially minimize low-cycle fatigue by transferring heat from at least the first component in response to signals from the at least one sensor.

40 Claims, 4 Drawing Sheets

APPARATUS AND METHOD TO SUBSTANTIALLY MINIMIZE LOW-CYCLE FATIGUE OF ELECTRICAL CONNECTIONS

FIELD OF THE INVENTION

The present invention relates generally to electronic devices, and more particularly to an apparatus and method to substantially minimize breakage or low-cycle fatigue of electrical connections between components.

BACKGROUND OF THE INVENTION

Electronic devices and integrated circuits are being required to perform more functions at ever increasing speeds. Component densities are also increasing while packaging size requirements are decreasing. The higher component densities, higher operating frequencies and tighter packaging requirements are resulting in the generation of more heat that must be managed for proper operation and longevity of current and future high performance electronic devices and circuits.

Components in an electronic device can be electrically connected to one another by solder connections. For example, a microelectronic die, chip or other component may be electrically connected to a printed wiring board (PWB) or the like by a plurality of solder ball connections or a ball-grid array (BGA). Because of possible size variations and differences in composition between the electrically connected components, they can expand and contract at different rates of thermal expansion during thermal cycling as the components build up heat under operating conditions and cool down during low duty cycles or non-operating conditions. Additionally, variations in ambient temperature under both operating and non-operating conditions can also cause the components to expand and contract at different rates. The repeated thermal expansion and contraction of the components can result in low-cycle fatigue and breakage of the solder connections or BGA connecting the components. Low-cycle fatigue can be an especially significant problem with ceramic components that have low expansion relative to typical PWB materials.

Thermal expansion mismatches can be managed to some extent by mechanical arrangements, such as aramid-reinforced printed wiring boards, heat sinks and by attachment of leads or columns to the components to increase mechanical compliance during thermal cycling. Solder fatigue can still occur using these mechanical arrangements because a contributing factor is the need to thermally control the actual solder connections or BGAs by transferring heat away from the connections. Additionally, these mechanical arrangements are passive and cannot react or adapt to changing conditions during the operational cycles of an electronic device.

Accordingly, for the reason stated above, and for other reasons that will become apparent upon reading and understanding the present specification, there is a need for an apparatus and method to substantially minimize the low-cycle fatigue or breakage of electrical connections between components caused by the thermal expansion mismatch between the components. There is also a need for an apparatus or method to substantially control low-cycle fatigue that is adaptive to changing conditions during the different operational cycles of the components and that can thermally control the actual electrical connections by actively transferring heat away from the connections.

SUMMARY OF THE INVENTION

In accordance with the present invention, an apparatus to prevent low-cycle fatigue or breakage of at least one electrical connection between a first component and a second component includes at least one thermoelectric device to thermally contact at least the first component and includes at least one sensor to couple to at least one of the first component and the second component. A controller is coupled to the at least one thermoelectric device and to the at least one sensor. The controller controls operation of the thermoelectric device to prevent low-cycle fatigue of the at least one electrical connection by transferring heat from at least the first component in response to signals from the at least one sensor.

In accordance with an embodiment of the present invention, an electronic device with thermal expansion control includes a first component and a second component electrically coupled to the first component. A thermoelectric device thermally contacts at least the first component and at least one sensor is coupled to one of the first component or the second component. A controller is coupled to the at least one sensor and to the thermoelectric device to transfer heat from at least the first component in response to signals from the at least one sensor.

In accordance with another embodiment of the present invention, a method to prevent low-cycle fatigue of at least one electrical connection between a first component and a second component includes sensing at least one of temperature, strain or deflection of at least one of the first component or the second component and transferring heat from at least one of the first component and the second component in response to the sensing of at least one of temperature, strain or deflection.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments can be utilized and that process or mechanical changes may be made without departing from the scope of the present invention.

Figure 1:
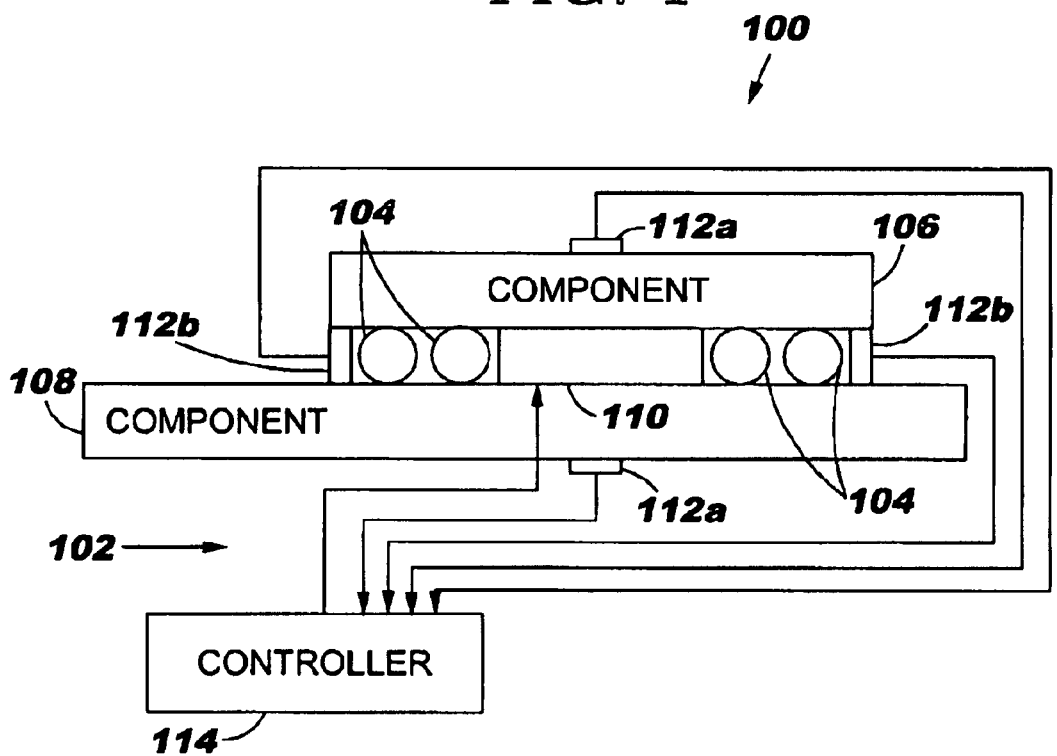
FIG. 1 is a block schematic diagram of an electronic device and an apparatus to prevent low-cycle fatigue of electrical connections between two components of the device in accordance with an embodiment of the present invention.

FIG. 1 is a block schematic diagram of an electronic device 100 and an apparatus 102 to prevent low-cycle fatigue of electrical connections 104 between a first component 106 and a second component 108 of the electronic device 100 in accordance with an embodiment of the present invention. The apparatus 102 includes a thermoelectric device 110 to thermally contact at least one of the first component 106 and the second component 108. In the embodiment shown in FIG. 1, the thermoelectric device 110 is disposed between the first component 106 and the second component 108 and can thermally contact both components 106 and 108 to transfer heat between the components 106 and 108. Alternatively, the thermoelectric device 110 can thermally contact only one of the components 106 or 108. The thermoelectric device 110 can be a Tellurex Zmax® thermoelectric module or the like as manufactured by the Tellurex Corporation of Traverse City, Mich.

At least one sensor 112a can be coupled to at least one of the first component 106 and the second component 108. In the embodiment shown in FIG. 1, a sensor 112b can be attached between the components 106 and 108. The sensor 112a can be a temperature sensor. Each of the sensors 112b can be a strain/deflection sensor, an optical sensor, a hall effect device or sensor, a capacitive sensor, a differential variable reluctance transducer or the like. The sensors 112 can be all one type or multiple different types of sensors can be used together at different locations on the components 106 and 108, depending upon the application, design constraints and environmental conditions. Each of the sensors 112 are electrically connected to a controller 114 and the controller 114 is electrically connected to the thermoelectric device 110. The controller 114 controls the operation of the thermoelectric device 110 to transfer thermal energy or heat between the components 106 and 108 in response to signals from the one or more sensors 112.

Figure 2A:
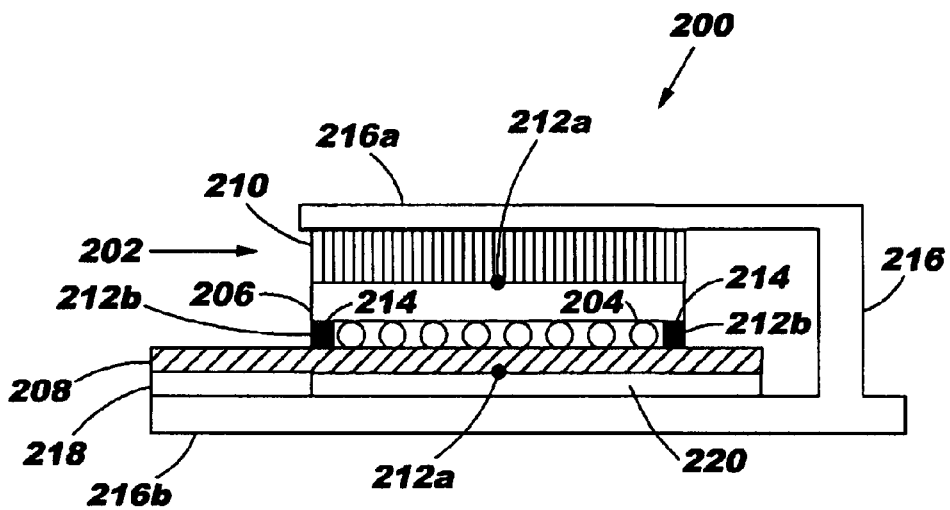
FIGS. 2A and 2B are block schematic diagrams of an electrical device and an apparatus to prevent low-cycle fatigue of electrical connections between two components of the device in accordance with another embodiment of the present invention.

FIG. 2A is a block schematic diagram of an electronic device or system 200 incorporating an apparatus 202 (shown in more detail in FIG. 2B) to prevent or substantially minimize low-cycle fatigue or breakage of electrical connections 204 between a first component 206 and a second component 208 in accordance with another embodiment of the present invention. The first component 206 can be a microelectronic die disposed in a package, a semiconductor chip or other electronic device and the second component 208 can be a printed wiring board (PWB) or the like. The electrical connections 204 can be a ball grid array (BGA) of solder balls or similar electrical connections. The apparatus 202 includes a thermoelectric device 210 that is thermally coupled to the first component 206. While the thermoelectric device 210 is shown as being coupled to the first component 206, it should be noted that depending upon design constraints, the thermoelectric device 210 could also be thermally coupled only to the second component 208 or the thermoelectric device 210 could be thermally coupled to both the first component 206 and the second component 208 similar to the embodiment shown in FIG. 1. In a further embodiment (not shown), a plurality of different thermoelectric devices 210 may be present and the different thermoelectric devices 210 could be coupled to each of the first and second components 206 and 208.

At least one sensor 212 is coupled to at least one of the first component 206 and the second component 208. In the embodiment shown in FIG. 2A, at least one temperature sensor 212a can be attached to each of the first and second components 206 and 208 proximal to a center of the BGA connections 204 and at least two strain/deflection type sensors 212b can each be disposed proximate to side edges 214 of the first component 206. Other types of sensors 212, such as those discussed with reference to FIG. 1, could be used as well depending upon design and environmental requirements.

A heat sink 216 can be thermally coupled to at least the thermoelectric device 210. In the embodiment shown in FIG. 2A, the heat sink 216 has a first portion 216a that thermally contacts the thermoelectric device 210 and a second portion 216b that is bonded to the second component 208 by a bonding material layer 218. The bonding material layer 218 can thermally insulate the second component 208 from the heat sink 216 and form an air gap 220 between the heat sink 216 and the second component 208. Alternatively, rather than integrally forming the first and second portions 216a and 216b of the heat sink 216, separate heat sinks could thermally contact both the first component 206 and the second component 208.

Figure 2B:
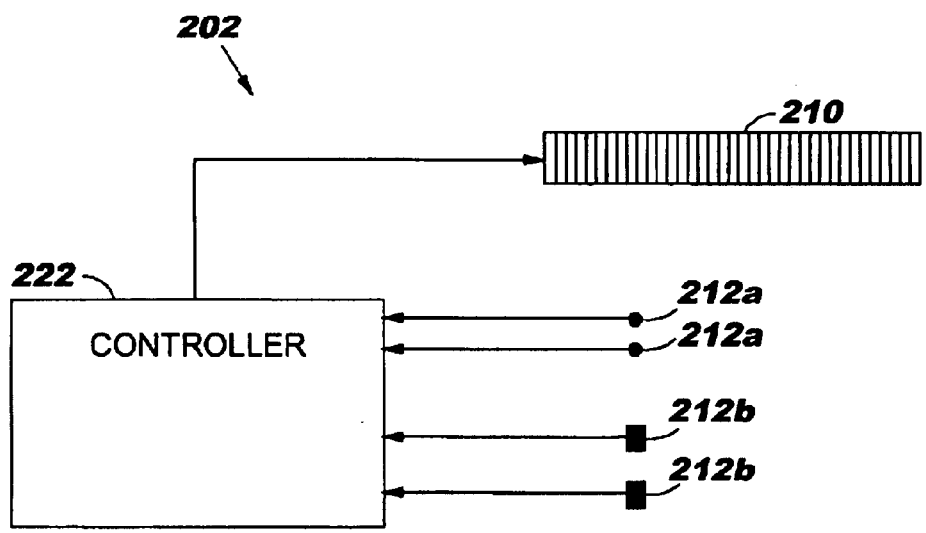

In FIG. 2B, a controller 222 (not shown in FIG. 2A) is electrically coupled to the temperature sensors 212a and to the strain/deflection sensors 212b and to the thermoelectric device 210. The controller 222 controls the operation of the thermoelectric device 210 in response to signals from the sensors 212a and 212b to transfer heat from the first component 206 to the heat sink 216.

Figure 3:
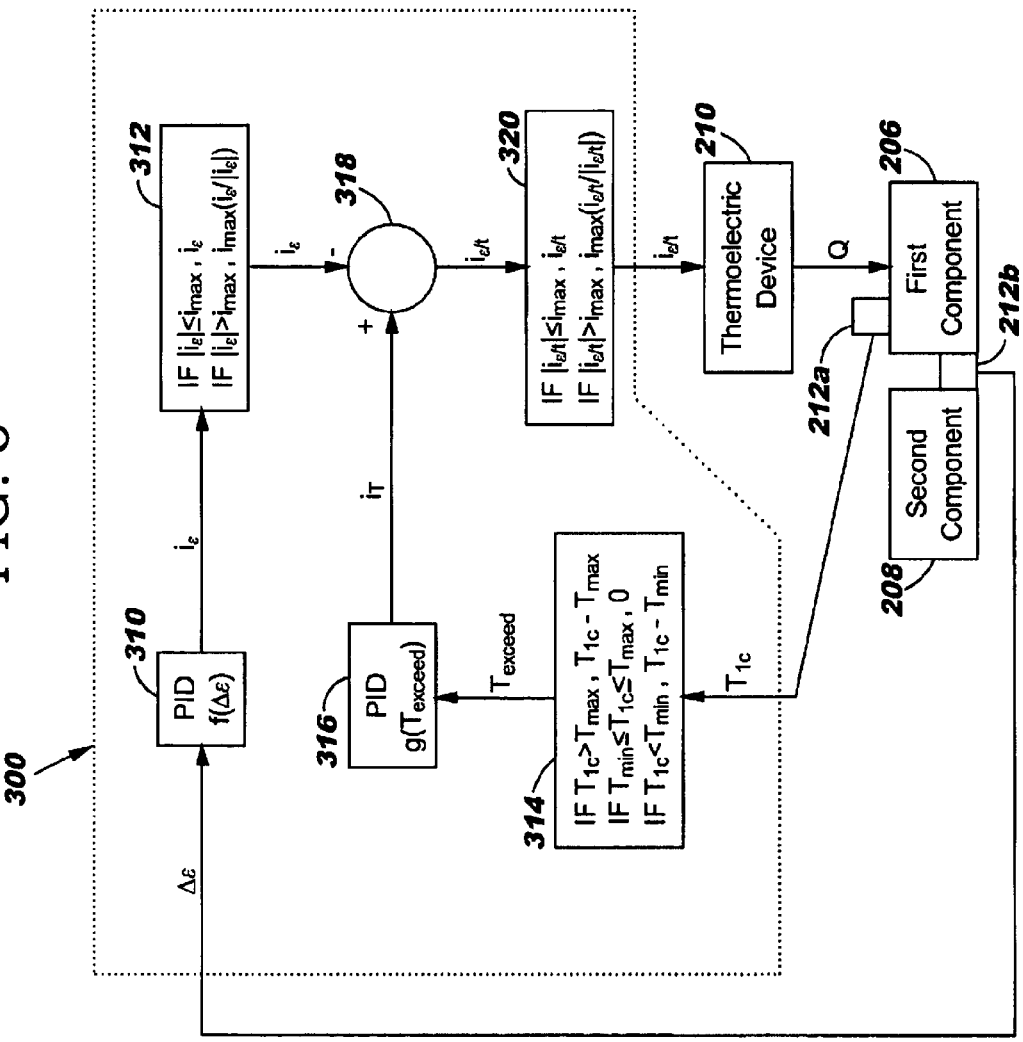
FIG. 3 is a block schematic diagram of a controller for use in an apparatus to prevent low-cycle fatigue of electrical connections between components in accordance with an embodiment of the present invention.

FIG. 3 is a block schematic diagram of a controller 300 in accordance with an embodiment of the present invention that can be used for the controller 114 of FIG. 1 or the controller 222 of FIG. 2B. Inputs to the controller 300 can include a first component temperature signal $T_{1C}$ and a differential strain control signal $\Delta \epsilon$. The first component temperature signal $T_{1C}$ corresponds to a temperature sensed by the temperature sensor 212a that is coupled to the first component 206. The differential strain control signal $\Delta \epsilon$ can be generated by the at least one strain/deflection sensor 212b coupled between the first component 206 and the second component 208. The at least one strain/deflection sensor 212b senses the difference in strain or deflection between the first component 206 and the second component 208. The differential strain signal $\Delta \epsilon$ is then a measure of the difference in strain or deflection between the first component 206 and the second component 208. The strain/deflection sensor 212b can generate the differential strain signal as a function of a first strain signal corresponding to the strain on the first component 206 and a second strain signal corresponding to the strain on the second component 208. The differential strain control signal $\Delta \epsilon$ is applied to a first proportional-integral-differential (PID) control circuit or algorithm 310 to generate a strain-control drive current signal $i_\epsilon$ as a function of the differential strain control signal $\Delta \epsilon$. Adequate control of the thermoelectric device 210 to control the temperature and strain/deflection of the first component 206 can be obtained in most circumstances by using only the proportional control segment or portion of the first PID 310 to generate the strain-control drive current $i_\epsilon$ as a function of the differential strain control signal $\Delta \epsilon$; although, the integral and differential control portions of the first PID 310 can also be used to improve stability and control accuracy. The strain-control drive current signal $i_\epsilon$ can be applied to a first limiter circuit or algorithm 312 to limit the strain-control drive current signal $i_\epsilon$ to a predetermined range. Accordingly, if the absolute value of $|i_\epsilon| \leq i_{max}$, then the first limiter 312 sets $i_\epsilon = i_\epsilon$. If the absolute value of the $|i_\epsilon| > i_{max}$, then the first limiter 312 sets $i_\epsilon = i_{max}(i_\epsilon/|i_\epsilon|)$ The strain control drive current $i_\epsilon$ is limited to not overdrive the thermoelectric device 210.

The first component temperature signal $T_{1C}$ sensed from the first component 206 by the sensor 212a can be applied to a second limiter circuit or algorithm 314 to limit the temperature signal to a predetermined range or quantity $T_{exceed}$. If $T_{1C} > T_{max}$, then the second limiter 314 sets $T_{exceed} = T_{1C} - T_{max}$. If $T_{min} \leq T_{1C} \leq T_{max}$, then the second limiter sets $T_{exceed} = 0$ and if $T_{1C} < T_{min}$, then the second limiter 314 sets $T_{exceed} = T_{min} - T_{1C}$. $T_{max}$ is a maximum design temperature that the first component 206 can reach to effectively control the low-cycle fatigue of the electrical connections 204 connecting the first and second components 206 and 208 and $T_{min}$ is a minimum operating temperature.

The $T_{exceed}$ signal is applied to a second proportional-integral-differential (PID) control circuit or algorithm 316 to generate a temperature-limiting drive current signal $i_T$ as a function of the $T_{exceed}$ signal. Adequate control of the thermoelectric device 210 to control the temperature and strain/deflection of the first component can be obtained by using only the proportional control segment or portion of the second PID 316 in most applications to generate the temperature-limiting drive current signal $i_T$ from the $T_{exceed}$ signal. Although, the integral and differential control segments of the second PID 316 can be used to improve stability and control accuracy of the temperature and strain/deflection of the first component 206. The first and second PIDs 310 and 316 can be digitally implemented as well as in analog form.

The strain-control drive current signal $i_\in$ is combined with the temperature-limiting drive current signal $i_T$ in a fourth summing junction, summer or combiner 318 to generate a combined current signal $i_{\in/T}$. In the embodiment shown in FIG. 3, the combined current signal $i_{\in/T}$ can be the difference between the strain-control drive current signal $i_\in$ and the temperature-limiting drive current signal $i_T$. The combined current signal $i_{\in/T}$ can be applied to a third limiter circuit or algorithm 320 to limit the combined current $i_{\in/T}$ to a predetermined level or range so as to not overdrive the thermoelectric device 210. If $|i_{\in/T}| \leq i_{max}$, then the third limiter 320 sets $i_{\in/T} = i_{\in/T}$ and if $|i_{\in/T}| > i_{max}$, then the third limiter 320 sets $i_{\in/T} = i_{max}(i_{\in/T}/|i_{\in/T}|)$. The limited, combined current $i_{\in/T}$ is then applied to the thermoelectric device 210 to control the operation of the thermoelectric device 210 to transfer thermal energy Q to cool the first component 206 or to transfer heat from the first component 206. It should be noted that the controller 300 can be implemented digitally as well as in hardware or an analog implementation.

Figure 4:
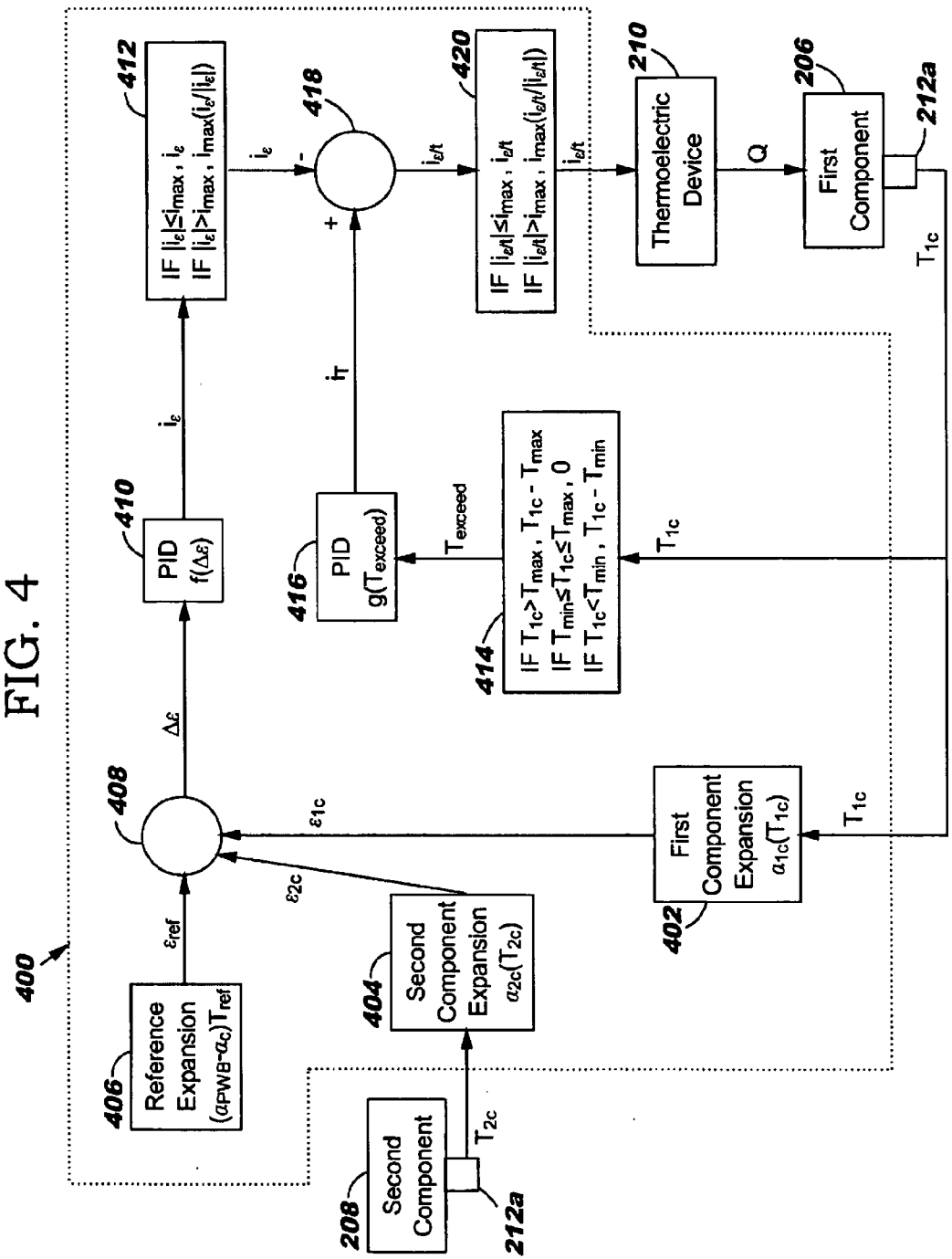
FIG. 4 is a block schematic diagram of a controller for use in an apparatus to prevent low-cycle fatigue of electrical connections between components in accordance with another embodiment of the present invention.

FIG. 4 is a schematic diagram of a controller 400 that can be used for the controller 114 of FIG. 1 or the controller 222 of FIG. 2B in accordance with another embodiment of the present invention. The controller 400 includes a first component expansion circuit or algorithm 402. The first component temperature signal $T_{1C}$ corresponding to a temperature sensed from the first component 206 is applied to the first component expansion circuit or algorithm 402 to generate a first component expansion or strain signal $\epsilon_{1C}$ as a function of the first component temperature signal $T_{1C}$. The first component expansion or strain signal $\epsilon_{1C}$ can be generated according to the relationship $\epsilon_{1C} = \alpha_{1C}(\Delta T_{1C})$, where $\alpha_{1C}$ is the thermal expansion coefficient for the first component 206.

The second component temperature signal $T_{2C}$ sensed from the second component 208 is applied to a second component expansion or strain signal circuit or algorithm 404 to generate a second component expansion or strain signal $\epsilon_{2C}$ as a function of the second component temperature signal $T_{2C}$. The second component expansion or strain signal can be generated according to the relationship $\epsilon_{2C} = \alpha_{2C}(T_{2C})$ where $\alpha_{2C}$ is the thermal expansion coefficient for the second component 208. A reference expansion $\epsilon_{ref}$ can be generated by a reference expansion circuit or algorithm 406 according to the relationship $\epsilon_{ref} = (\alpha_{2C} - \alpha_{1C})T_{ref}$. The reference temperature signal $T_{ref}$ can be a temperature at which both components 206 and 208 are neutral or have zero strain or deflection, such as about room temperature.

A differential strain control signal $\Delta\epsilon$ can be generated by combining $\epsilon_{1C}$, $\epsilon_{2C}$ and $\epsilon_{ref}$ in a first summing junction, summing algorithm, summer or combiner 408. In the embodiment shown in FIG. 4, the differential strain control signal $\Delta\epsilon$ can be generated by determining the difference between $\epsilon_{1C}$, $\epsilon_{2C}$ and $\epsilon_{ref}$. The differential strain control signal $\Delta\epsilon$ is applied to a first proportional-integral-differential (PID) control circuit or algorithm 410 to generate a strain-control drive current signal $i_{531}$ as a function of the differential strain control signal $\Delta\epsilon$. As previously discussed, adequate control of the thermoelectric device 210 to control the temperature and strain/deflection of the first component 206 can be realized by using only the proportional control segment of the first PID 410 to generate the strain-control drive current $i_\in$. Although, the integral and differential control segments of the first PID 410 can be used to improve stability and control accuracy of the temperature and strain/deflection of the first component 206. The strain-control drive current signal $i_\in$ can be applied to a first limiter circuit or algorithm 412 to limit the strain-control drive current signal $i_\in$ to a predetermined range similar the first limiter 312 in FIG. 3 as previously discussed.

The first component temperature signal $T_{1C}$ can also be applied to a second limiter circuit or algorithm 414 similar to the limiter circuit or algorithm 314 of controller 300 to limit the temperature signal sensed from the first component 206 to the predetermined range or quantity $T_{exceed}$. The $T_{exceed}$ signal is applied to a second proportional-integral-differential (PID) control circuit or algorithm 416 to generate a temperature-limiting drive current signal $i_T$ as a function of the $T_{exceed}$ signal. As previously discussed, adequate control of the thermoelectric device 210 is possible by using only the proportional segment of the second PID 416; although the integral and differential segments of the second PID 416 can be used to improve stability and control accuracy of the temperature and strain/deflection of the first component 206.

The strain-control drive current signal $i_\in$ is combined with the temperature-limiting drive current signal $i_T$ in a second summing junction, summer or combiner 418 to generate a combined current signal $i_{\in/T}$. In the embodiment shown in FIG. 4, the combined current signal $i_{\in/T}$ can be the difference between the strain-control drive current signal $i_\in$ and the temperature-limiting drive current signal $i_T$. The combined current signal $i_{\in/T}$ can be applied to a third limiter circuit or algorithm 420 to limit the combined current $i_{\in/T}$ and not overdrive the thermoelectric device 210. The limited, combined current $i_{\in/T}$ is then applied to the thermoelectric device 210 to cause the thermoelectric device 210 to transfer thermal energy Q to cool the first component 206 or to transfer heat from the first component 206.

Accordingly, as the temperature and strain on the first component 206 and the second component 208 change during the operational cycles of the electronic device 200 (FIG. 2), the strain-control drive current signal $i_\in$ and the temperature-limiting drive current signal $i_T$ will change in correspondence therewith as will the combined current signal $i_{\in/T}$. Thus, the apparatus 202 (FIG. 2) continually adapts to changing thermal conditions to control the operation of the thermoelectric device 210 to transfer heat from the first component 206, or if the thermoelectric device 210 is coupled to the second component 208, to transfer heat form the second component 208.

The first and second PIDs 410 and 416 can have digital as well as analog implementations and the controller 400 may also be implemented in software or digitally or in an analog implementation.

The present invention thus provides an apparatus and method to substantially minimize the low-cycle fatigue or breakage of electrical connections between components caused by the thermal expansion mismatch between the components. The present invention also provides an apparatus and method that is adaptive to changing conditions during the different operational cycles of the components to substantially control low-cycle fatigue.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. An apparatus to substantially minimize low-cycle fatigue of at least one electrical connection between a first component and a second component, comprising:
   at least one thermoelectric device in thermal contact with at least the first component;
   at least one sensor coupled to at least one of the first component and the second component, wherein the at least one sensor includes at least one of a temperature sensor, a strain/deflection sensor, an optical sensor, a hall effect device, a capacitive sensor and a differential variable sensor; and
   a controller coupled to the at least one sensor and to the at least one thermoelectric device to transfer heat from at least the first component in response to signals from the at least one sensor.

2. The apparatus of claim 1, wherein the first component is electrically connected to the second component by a ball grid array and wherein the thermoelectric device transfers heat from the first component to substantially minimize low-cycle fatigue of the ball grid array caused by different rates of thermal expansion between the first component and the second component.

3. The apparatus of claim 1, wherein the first component is an electronic device and the second component is a printed wiring board to which the electronic device is electrically connected.

4. The apparatus of claim 1, further comprising a heat sink thermally coupled to the at least one thermoelectric device.

5. The apparatus of claim 1, further comprising a heat sink thermally coupled to at least one of the at least one thermoelectric device and to the second component.

6. The apparatus of claim 1, further comprising a first heat sink thermally coupled to the at least one thermoelectric device and a second heat sink thermally coupled to the second component.

7. The apparatus of claim 6, wherein the first heat sink and the second heat sink are integrally formed.

8. The apparatus of claim 1, wherein the controller controls the at least one thermoelectric device to perform at least one of substantially minimizing deflection of the first component and maintaining a temperature of the first component within predetermined limits.

9. The apparatus of claim 1, wherein the controller comprises:
   a first proportional-integral-differential (PID) to generate a strain-control drive current from a differential strain signal;
   a second PID to generate a temperature-limiting drive current from a signal corresponding to a temperature sensed from the first component; and
   a combiner to generate a combined current signal from the strain-control drive current and the temperature-limiting drive current, wherein the combined current signal controls operation of the thermoelectric device.

10. The apparatus of claim 9, wherein the differential strain signal comprises a function of at least a first strain signal from the first component and a second strain signal from the second component.

11. The apparatus of claim 9, further comprising at least one sensor coupled between the first component and the second component to generate the differential strain signal.

12. The apparatus of claim 9, wherein the differential strain signal is a measure of the difference in strain or deflection between the first component and the second component.

13. The apparatus of claim 9, wherein the differential strain signal comprises at least a first strain signal derived from a first sensor coupled to the first component, a second strain signal derived from a second sensor coupled to the second component and a third strain signal derived from a reference signal.

14. The apparatus of claim 9, wherein the differential strain signal is a function of a temperature sensed from the first component, a temperature sensed from the second component and a reference temperature.

15. The apparatus of claim 9, further comprising a limiter to limit the temperature sensed from the first component to a predetermined range of temperatures.

16. The apparatus of claim 9, further comprising a limiter coupled to the first PID to limit the strain-control drive current to a predetermined maximum current.

17. The apparatus of claim 9, further comprising a limiter coupled to the combiner to limit the combined current to a predetermined range.

18. The apparatus of claim 9, wherein the first PID and the second PID are digitally implemented.

19. An electronic device with thermal expansion control, comprising:
   a first component;
   a second component electrically coupled to the first component; a
   thermoelectric device in thermal contact with at least the first component;
   at least one sensor coupled to one of the first component or the second component, wherein the at least one sensor comprises at least one of a temperature sensor, a strain/deflection sensor, an optical sensor, a hall effect sensor, a capacitive sensor and a differential variable reluctance transducer; and
   a controller coupled to the at least one sensor and to the thermoelectric device to transfer heat from at least the first component in response to signals from the at least one sensor.

20. The electronic device of claim 19, wherein the first component is electrically connected to the second component by at least one solder connection and wherein the thermoelectric device transfers heat from at least the first component to substantially minimize low-cycle fatigue of the at least one solder connection caused by different rates of thermal expansion between the first component and the second component.

21. The electronic device of claim 19, further comprising a heat sink thermally coupled to at least the thermoelectric device.

22. The electronic device of claim 19, wherein the controller comprises:
   a first proportional-integral-differential (PID) to generate a strain-control drive current from a differential strain signal;
   a second PID to generate a temperature-limiting drive current from a signal corresponding to a temperature sensed from the first component; and
   a combiner to generate a combined current signal from the strain-control drive current and the temperature-limiting drive current, wherein the combined current signal controls operation of the thermoelectric device.

23. The electronic device of claim 22, wherein the differential strain signal comprises a difference between a first strain signal corresponding to a strain on the first component and a second strain signal corresponding to a strain on the second component.

24. The electronic device of claim 22, further comprising at least one sensor coupled between the first component and the second component to generate the differential strain signal.

25. The electronic device of claim 22, wherein the differential strain signal is a function of a temperature sensed from the first component, a temperature sensed from the second component and a reference temperature.

26. A method to substantially minimize low-cycle fatigue of at least one electrical connection between a first component and a second component, comprising:

sensing at least one of temperature, strain or deflection of at least one of the first component or the second component; and transferring heat from at least one of the first component and the second component in response to the sensing of the at least one of temperature, strain or deflection.

27. The method of claim 26, wherein sensing strain or deflection comprises at least one of applying at least one of a strain/deflection sensor, an optical sensor, a hall effect sensor, a capacitive sensor and a differential variable reluctance transducer to at least one of the first component and the second component.

28. The method of claim 26, wherein transferring heat comprises dissipating heat into one of a heat sink or an ambient.

29. The method of claim 26, wherein transferring heat comprises:

generating a strain-control drive current;

generating a temperature-limiting drive current; and generating a combined signal from the strain-control drive current and the temperature-limiting drive current to control operation of a thermoelectric device coupled to at least one of the first component and the second component.

30. The method of claim 29, wherein generating the strain-control drive current comprises:

generating a differential strain signal; and applying a PID to the differential strain signal to generate the strain-control drive current.

31. The method of claim 30, wherein generating the differential strain signal comprises sensing a difference in strain or deflection between the first component and the second component.

32. The method of claim 30, wherein generating the differential strain signal comprises:

sensing a temperature of the first component;

generating a first component strain signal as a function of the temperature of the first component;

sensing a temperature of the second component;

generating a second component strain signal as a function of the temperature of the second component;

generating a reference strain signal as a function of a reference temperature; and combining the first component strain signal, the second component strain signal and the reference strain signal to generate the differential strain signal.

33. The method of claim 29, wherein generating the temperature-limiting drive current comprises:

sensing a temperature of the first component; and applying a PID to a signal corresponding to the sensed temperature of the first component to generate the temperature-limiting drive current.

34. A method of making an apparatus to substantially minimize low-cycle fatigue of electrical connections between a first component and a second component, comprising:

thermally coupling at least one thermoelectric device to at least one of the first component and the second component;

coupling at least one sensor to at least one of the first component and the second component; and coupling the at least one thermoelectric device and the at least one sensor to a controller to transfer heat from the one component in response to signals from the at least one sensor.

35. The method of claim 34, wherein coupling at least one sensor comprises coupling at least one of a temperature sensor, a strain/deflection sensor, an optical sensor, a hall effect device, a capacitive sensor and a differential variable reluctance transducer to at least one of the first component and the second component.

36. The method of claim 34, further comprising thermally coupling a heat sink to the at least one thermoelectric device.

37. The method of claim 34, further comprising forming the controller, wherein forming the controller includes:

forming a first PID to generate a strain-control current from a differential strain signal;

forming a second PID to generate a temperature-limiting drive current from a signal corresponding to a temperature sensed from the first component; and forming a combiner to generate a combined current signal from the strain-control drive current and the temperature-limiting drive current, wherein the combined current signal controls operation of the thermoelectric device.

38. An apparatus to substantially minimize low-cycle fatigue of at least one electrical connection between a first component and a second component, comprising:

at least one thermoelectric device in thermal contact with at least the first component;

a plurality of sensors coupled to at least one of the first component and the second component; and a controller coupled to the plurality of sensor and to the at least one thermoelectric device to transfer heat from at least the first component in response to signals from the plurality of sensors to substantially minimize low-cycle fatigue of at least one electrical connection between the first component and the second component.

39. The apparatus of claim 38, wherein the first component is electrically connected to the second component by a ball grid array and wherein the thermoelectric device transfers heat from the first component to substantially minimize low-cycle fatigue of the ball grid array caused by different rates of thermal expansion between the first component and the second component.

40. The apparatus of claim 38, wherein the controller comprises:

a first proportional-integral-differential (PID) to generate a strain-control drive current from a differential strain signal;

a second PID to generate a temperature-limiting drive current from a signal corresponding to a temperature sensed from the first component; and a combiner to generate a combined current signal from the strain-control drive current and the temperature-limiting drive current, wherein the combined current signal controls operation of the thermoelectric device.

* * * * *